(12) United States Patent
Thomas et al.

(10) Patent No.: US 12,243,725 B2
(45) Date of Patent: Mar. 4, 2025

(54) HIGH TEMPERATURE RF CONNECTION WITH INTEGRAL THERMAL CHOKE

(71) Applicant: Lam Research Corporation, Fremont, CA (US)

(72) Inventors: Timothy S. Thomas, Wilsonville, OR (US); Vincent Burkhart, Cupertino, CA (US); Joel Hollingsworth, Portland, OR (US); David French, Fort Myers, FL (US); Damien Slevin, Salem, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/823,744

(22) Filed: Aug. 31, 2022

(65) Prior Publication Data

US 2022/0415620 A1 Dec. 29, 2022

Related U.S. Application Data

(63) Continuation of application No. 15/696,068, filed on Sep. 5, 2017, now Pat. No. 11,469,084.

(51) Int. Cl.
*H01J 37/32* (2006.01)
*C23C 16/458* (2006.01)
*C23C 16/505* (2006.01)

(52) U.S. Cl.
CPC .......... *H01J 37/32577* (2013.01); *H01J 37/32082* (2013.01); *C23C 16/4586* (2013.01);
(Continued)

(58) Field of Classification Search
CPC ........... H01J 37/32082; H01J 37/32091; H01J 37/32532; H01J 37/32559;
(Continued)

(56) References Cited

U.S. PATENT DOCUMENTS 2,491,167 A * 12/1949 Drew .................... B23B 31/202
   279/156
2,684,698 A *  7/1954 Shaff ....................... B25B 23/10
   81/453
(Continued)

FOREIGN PATENT DOCUMENTS

CN  200956667 Y  10/2007
CN  101495670 A   7/2009
(Continued)

OTHER PUBLICATIONS

European Extended Search Report dated Feb. 8, 2021 issued in Application No. EP 188093256.
(Continued)

*Primary Examiner* — Kurt Sweely
(74) *Attorney, Agent, or Firm* — Weaver Austin Villeneuve & Sampson LLP (57) ABSTRACT

A thermal choke rod connecting a radio frequency source to a substrate support of a plasma processing system includes a tubular member having a first connector for connecting to an RF rod coupled to the substrate support and a second connector for connecting to an RF strap that couples to the RF source. A tubular segment extends between the first and second connectors. The first connector has a conically-shaped end region that tapers away from the inner surface thereof to an outer surface in a direction toward the tubular segment, and slits that extend for a prescribed distance from a terminal end of the first connector. The outer surface of the tubular segment has a threaded region for threaded engagement with an annular cap that fits over the first connector and reduces an inner diameter of the first connector upon contact with the conically-shaped end region of the first connector.

20 Claims, 7 Drawing Sheets

(52) U.S. Cl.
CPC ....... *C23C 16/505* (2013.01); *H01J 37/32091* (2013.01); *H01J 37/32715* (2013.01); *H01J 37/32724* (2013.01)

(58) Field of Classification Search
CPC ........... H01J 37/32577; H01J 37/32715; H01J 37/32724; C23C 16/4586; C23C 16/505; C23C 16/509
See application file for complete search history.

(56) References Cited

U.S. PATENT DOCUMENTS

| | | | |
|---|---|---|---|
| 3,895,832 A * | 7/1975 | Ellis | F16L 19/12 |
| | | | 285/334.4 |
| 4,552,430 A * | 11/1985 | Myers | H01H 71/08 |
| | | | 439/786 |
| 4,657,616 A * | 4/1987 | Benzing | H01J 5/46 |
| | | | 156/345.43 |
| 4,692,836 A | 9/1987 | Suzuki | |
| 4,897,853 A * | 1/1990 | Argent | H05B 3/03 |
| | | | 373/36 |
| 5,463,526 A | 10/1995 | Mundt | |
| 5,507,874 A | 4/1996 | Su et al. | |
| 5,560,780 A | 10/1996 | Wu et al. | |
| 5,633,073 A | 5/1997 | Cheung et al. | |
| 5,737,178 A | 4/1998 | Herchen | |
| 5,812,362 A | 9/1998 | Ravi | |
| 5,829,791 A | 11/1998 | Kotsubo et al. | |
| 5,841,624 A | 11/1998 | Xu et al. | |
| 5,942,282 A | 8/1999 | Tada et al. | |
| 6,066,836 A | 5/2000 | Chen et al. | |
| 6,072,685 A | 6/2000 | Herchen | |
| 6,081,414 A | 6/2000 | Flanigan et al. | |
| 6,104,596 A | 8/2000 | Hausmann | |
| 6,151,203 A * | 11/2000 | Shamouilian | H01L 21/6833 |
| | | | 361/234 |
| 6,213,478 B1 * | 4/2001 | Nishikawa | H01L 21/68792 |
| | | | 118/503 |
| 6,221,221 B1 | 4/2001 | Al-Shaikh et al. | |
| 6,239,403 B1 | 5/2001 | Dible et al. | |
| 6,261,977 B1 | 7/2001 | Tsai et al. | |
| 6,403,491 B1 | 6/2002 | Liu et al. | |
| 6,466,881 B2 | 10/2002 | Shih et al. | |
| 6,592,709 B1 * | 7/2003 | Lubomirsky | H01J 37/32834 |
| | | | 156/345.33 |
| 6,776,892 B1 | 8/2004 | Ritzdorf et al. | |
| 6,858,265 B2 | 2/2005 | Redeker et al. | |
| 6,879,051 B1 | 4/2005 | Singh et al. | |
| 7,625,227 B1 | 12/2009 | Henderson et al. | |
| 9,213,021 B2 | 12/2015 | Plant et al. | |
| 9,805,965 B2 | 10/2017 | Sadjadi et al. | |
| 9,850,573 B1 | 12/2017 | Sun | |
| 10,079,154 B1 | 9/2018 | Le et al. | |
| 10,083,818 B2 | 9/2018 | Khaja et al. | |
| 10,121,641 B2 | 11/2018 | Long et al. | |
| 10,147,610 B1 | 12/2018 | Lingampalli et al. | |
| 10,403,535 B2 | 9/2019 | Ye et al. | |
| 10,431,467 B2 | 10/2019 | Lingampalli et al. | |
| 10,515,781 B1 | 12/2019 | Long et al. | |
| 10,784,083 B2 | 9/2020 | Long et al. | |
| 10,847,345 B2 | 11/2020 | Long et al. | |
| 10,937,684 B2 | 3/2021 | Horiuchi | |
| 11,086,233 B2 | 8/2021 | Topping et al. | |
| 11,183,368 B2 | 11/2021 | French et al. | |
| 11,289,355 B2 | 3/2022 | Gomm | |
| 11,469,084 B2 | 10/2022 | Thomas et al. | |
| 11,724,362 B2 | 8/2023 | Bajaj et al. | |
| 11,745,302 B2 | 9/2023 | Ganapathiappan et al. | |
| 11,776,789 B2 | 10/2023 | Dorf et al. | |
| 11,817,341 B2 | 11/2023 | Gomm | |
| 11,835,868 B2 | 12/2023 | Topping et al. | |
| 11,848,176 B2 | 12/2023 | Dorf et al. | |
| 11,990,360 B2 | 5/2024 | Vasquez et al. | |
| 2001/0019472 A1 | 9/2001 | Kanno et al. | |
| 2001/0027972 A1 | 10/2001 | Yamaguchi et al. | |
| 2003/0051665 A1 | 3/2003 | Zhao et al. | |
| 2003/0089600 A1 | 5/2003 | Natsuhara et al. | |
| 2003/0180459 A1 | 9/2003 | Redeker et al. | |
| 2004/0074869 A1 | 4/2004 | Wang et al. | |
| 2004/0120095 A1 | 6/2004 | Yanagida | |
| 2004/0137169 A1 | 7/2004 | Carollo | |
| 2005/0042881 A1 | 2/2005 | Nishimoto et al. | |
| 2005/0183669 A1 | 8/2005 | Parkhe et al. | |
| 2005/0191827 A1 | 9/2005 | Collins et al. | |
| 2005/0213279 A1 | 9/2005 | Hayakawa | |
| 2005/0274324 A1 | 12/2005 | Takahashi et al. | |
| 2006/0005930 A1 | 1/2006 | Ikeda et al. | |
| 2006/0011611 A1 | 1/2006 | Goto et al. | |
| 2006/0081558 A1 | 4/2006 | Collins et al. | |
| 2006/0120011 A1 | 6/2006 | Handa et al. | |
| 2006/0158821 A1 | 7/2006 | Miyashita | |
| 2006/0237442 A1 | 10/2006 | Goto et al. | |
| 2006/0280875 A1 | 12/2006 | Tomita et al. | |
| 2007/0141729 A1 | 6/2007 | Dhindsa et al. | |
| 2007/0223173 A1 | 9/2007 | Fujisawa et al. | |
| 2007/0253139 A1 | 11/2007 | Nakano et al. | |
| 2007/0256786 A1 | 11/2007 | Zhou et al. | |
| 2008/0009417 A1 | 1/2008 | Lou et al. | |
| 2008/0029032 A1 | 2/2008 | Sun et al. | |
| 2008/0037195 A1 | 2/2008 | Himori et al. | |
| 2008/0062609 A1 | 3/2008 | Himori et al. | |
| 2008/0167720 A1 | 7/2008 | Melkent | |
| 2008/0236493 A1 | 10/2008 | Sakao | |
| 2008/0258411 A1 | 10/2008 | Miura et al. | |
| 2009/0059462 A1 | 3/2009 | Mizuno et al. | |
| 2009/0197401 A1 | 8/2009 | Li et al. | |
| 2009/0284894 A1 | 11/2009 | Cooke | |
| 2009/0285360 A1 | 11/2009 | Cao et al. | |
| 2009/0314208 A1 | 12/2009 | Zhou et al. | |
| 2010/0039747 A1 | 2/2010 | Sansoni et al. | |
| 2010/0104852 A1 | 4/2010 | Fletcher et al. | |
| 2010/0126847 A1 | 5/2010 | Dhindsa et al. | |
| 2010/0323124 A1 | 12/2010 | Vartabedian et al. | |
| 2011/0005686 A1 | 1/2011 | Tanaka et al. | |
| 2011/0031217 A1 | 2/2011 | Himori | |
| 2011/0096461 A1 | 4/2011 | Yoshikawa et al. | |
| 2012/0044609 A1 | 2/2012 | Cooke et al. | |
| 2012/0164834 A1 | 6/2012 | Jennings et al. | |
| 2012/0247678 A1 | 10/2012 | Takahashi et al. | |
| 2013/0027838 A1 | 1/2013 | Hori et al. | |
| 2013/0070384 A1 | 3/2013 | Cooke et al. | |
| 2013/0087447 A1 | 4/2013 | Bodke et al. | |
| 2013/0126206 A1 * | 5/2013 | Zhou | H01J 37/32577 |
| | | | 174/68.1 |
| 2013/0133394 A1 * | 5/2013 | Hasenberg | B21D 19/04 |
| | | | 72/312 |
| 2013/0155569 A1 | 6/2013 | Suuronen et al. | |
| 2014/0048720 A1 | 2/2014 | Hayakawa et al. | |
| 2014/0069585 A1 | 3/2014 | Aoto et al. | |
| 2014/0087587 A1 | 3/2014 | Lind | |
| 2014/0118880 A1 | 5/2014 | He et al. | |
| 2014/0154465 A1 | 6/2014 | Sun et al. | |
| 2014/0159325 A1 | 6/2014 | Parkhe et al. | |
| 2014/0177123 A1 | 6/2014 | Thach et al. | |
| 2014/0203526 A1 | 7/2014 | Banda et al. | |
| 2014/0334060 A1 | 11/2014 | Parkhe et al. | |
| 2014/0355169 A1 | 12/2014 | Maeta et al. | |
| 2014/0356538 A1 | 12/2014 | Schmitt et al. | |
| 2015/0043123 A1 | 2/2015 | Cox | |
| 2015/0044947 A1 | 2/2015 | Lu et al. | |
| 2015/0116889 A1 | 4/2015 | Yamasaki et al. | |
| 2015/0179412 A1 | 6/2015 | Chhatre et al. | |
| 2015/0228528 A1 | 8/2015 | Behdjat | |
| 2015/0241783 A1 | 8/2015 | Carcasi et al. | |
| 2015/0311043 A1 | 10/2015 | Sun et al. | |
| 2015/0311105 A1 | 10/2015 | Sadjadi et al. | |
| 2015/0311108 A1 | 10/2015 | Horiuchi | |
| 2015/0323050 A1 | 11/2015 | Ohno | |
| 2015/0371876 A1 | 12/2015 | Terauchi et al. | |
| 2016/0002779 A1 | 1/2016 | Lin et al. | |
| 2016/0035610 A1 | 2/2016 | Park et al. | |
| 2016/0064264 A1 | 3/2016 | Kulshreshtha et al. | |
| 2016/0086772 A1 | 3/2016 | Khaja et al. | |

(56) References Cited

U.S. PATENT DOCUMENTS

| | | |
|---|---|---|
| 2016/0090650 A1 | 3/2016 | Qian et al. |
| 2016/0111315 A1 | 4/2016 | Parkhe |
| 2016/0196984 A1 | 7/2016 | Lill et al. |
| 2016/0225652 A1 | 8/2016 | Tran et al. |
| 2016/0281230 A1 | 9/2016 | Varadarajan et al. |
| 2016/0333475 A1 | 11/2016 | Gomm et al. |
| 2016/0336210 A1 | 11/2016 | Cooke et al. |
| 2016/0336213 A1 | 11/2016 | Gomm et al. |
| 2016/0340781 A1 | 11/2016 | Thomas et al. |
| 2016/0343600 A1 | 11/2016 | Parkhe |
| 2016/0358755 A1 | 12/2016 | Long et al. |
| 2016/0372307 A1 | 12/2016 | Yang et al. |
| 2017/0004925 A1 | 1/2017 | Abrecht et al. |
| 2017/0018411 A1 | 1/2017 | Sriraman et al. |
| 2017/0040148 A1 | 2/2017 | Augustino et al. |
| 2017/0040198 A1 | 2/2017 | Lin et al. |
| 2017/0103908 A1 | 4/2017 | Lew et al. |
| 2017/0110358 A1 | 4/2017 | Sadjadi et al. |
| 2017/0110385 A1 | 4/2017 | Kawajiri et al. |
| 2017/0140970 A1 | 5/2017 | Boyd, Jr. et al. |
| 2017/0256431 A1 | 9/2017 | Parkhe |
| 2017/0365907 A1 | 12/2017 | Kapoor et al. |
| 2018/0025891 A1 | 1/2018 | Marakhtanov et al. |
| 2018/0061684 A1 | 3/2018 | Parkhe |
| 2018/0096869 A1 | 4/2018 | Yoshida et al. |
| 2018/0112311 A1 | 4/2018 | Fenwick et al. |
| 2018/0308738 A1 | 10/2018 | Tobe |
| 2018/0318890 A1 | 11/2018 | Yasseri et al. |
| 2018/0323039 A1 | 11/2018 | Woo et al. |
| 2018/0350568 A1 | 12/2018 | Mitsumori et al. |
| 2018/0350610 A1 | 12/2018 | Lingampalli et al. |
| 2018/0350649 A1 | 12/2018 | Gomm |
| 2019/0019713 A1 | 1/2019 | Hidaka et al. |
| 2019/0051497 A1 | 2/2019 | Long et al. |
| 2019/0067076 A1 | 2/2019 | Zvokelj |
| 2019/0071778 A1 | 3/2019 | Thomas et al. |
| 2019/0115241 A1 | 4/2019 | Vellore et al. |
| 2019/0136373 A1 | 5/2019 | Yeh et al. |
| 2019/0157052 A1 | 5/2019 | Doan et al. |
| 2019/0218663 A1 | 7/2019 | Funakubo et al. |
| 2019/0221406 A1 | 7/2019 | Funakubo et al. |
| 2019/0237341 A1 | 8/2019 | Yu et al. |
| 2019/0237353 A1 | 8/2019 | Thomas et al. |
| 2019/0267268 A1 | 8/2019 | Abel et al. |
| 2019/0276366 A1 | 9/2019 | Sun et al. |
| 2019/0294050 A1 | 9/2019 | Topping et al. |
| 2019/0341289 A1 | 11/2019 | Parkhe |
| 2019/0355556 A1 | 11/2019 | Takahashi |
| 2019/0385821 A1 | 12/2019 | Long et al. |
| 2020/0013590 A1 | 1/2020 | Liu et al. |
| 2020/0043703 A1 | 2/2020 | French et al. |
| 2020/0111644 A1 | 4/2020 | Long et al. |
| 2020/0126767 A1 | 4/2020 | Takeda et al. |
| 2020/0340102 A1 | 10/2020 | Kimura et al. |
| 2021/0043490 A1 | 2/2021 | Vasquez et al. |
| 2021/0071300 A1 | 3/2021 | Bajaj et al. |
| 2021/0263542 A1 | 8/2021 | Breitlow et al. |
| 2021/0265138 A1 | 8/2021 | Ikeda et al. |
| 2021/0333715 A1 | 10/2021 | Topping et al. |
| 2021/0340668 A1 | 11/2021 | Macpherson et al. |
| 2022/0005680 A1 | 1/2022 | Suetsugu et al. |
| 2022/0044909 A1 | 2/2022 | French et al. |
| 2022/0181127 A1 | 6/2022 | Erickson et al. |
| 2022/0181184 A1 | 6/2022 | Gomm |
| 2022/0334554 A1 | 10/2022 | Feng et al. |
| 2022/0375719 A1 | 11/2022 | Topping et al. |
| 2024/0038568 A1 | 2/2024 | Gomm |
| 2024/0045344 A1 | 2/2024 | Topping et al. |
| 2024/0266202 A1 | 8/2024 | Vasquez et al. |

FOREIGN PATENT DOCUMENTS

| | | |
|---|---|---|
| CN | 101542712 A | 9/2009 |
| CN | 102024736 A | 4/2011 |
| CN | 103069550 A | 4/2013 |
| CN | 105981156 A | 9/2016 |
| CN | 106148915 A | 11/2016 |
| CN | 106148916 A | 11/2016 |
| CN | 106356274 A | 1/2017 |
| CN | 106575634 A | 4/2017 |
| CN | 107452616 A | 12/2017 |
| CN | 107665804 A | 2/2018 |
| CN | 107710378 A | 2/2018 |
| EP | 2015343 A2 | 1/2009 |
| JP | H07169737 A | 7/1995 |
| JP | H07201496 A | 8/1995 |
| JP | H08154387 A | 6/1996 |
| JP | H09176860 A | 7/1997 |
| JP | H09213778 A | 8/1997 |
| JP | 2001156162 A | 6/2001 |
| JP | 2001237051 A | 8/2001 |
| JP | 2002512448 A | 4/2002 |
| JP | 2003124296 A | 4/2003 |
| JP | 2003160874 A | 6/2003 |
| JP | 2004095722 A | 3/2004 |
| JP | 2005018992 A | 1/2005 |
| JP | 2005072286 A | 3/2005 |
| JP | 2005235890 A | 9/2005 |
| JP | 2005347620 A | 12/2005 |
| JP | 2006302887 A | 11/2006 |
| JP | 4034145 B2 | 1/2008 |
| JP | 2008270197 A | 11/2008 |
| JP | 2009123929 A | 6/2009 |
| JP | 2009256789 A | 11/2009 |
| JP | 2010109316 A | 5/2010 |
| JP | 2011049428 A | 3/2011 |
| JP | 2011061040 A | 3/2011 |
| JP | 2014038928 A | 2/2014 |
| JP | 2014505362 A | 2/2014 |
| JP | 2014082449 A | 5/2014 |
| JP | 2016213456 A | 12/2016 |
| JP | 2016213463 A | 12/2016 |
| JP | 2017055100 A | 3/2017 |
| JP | 2017228526 A | 12/2017 |
| JP | 2018117024 A | 7/2018 |
| JP | 7476169 B2 | 4/2024 |
| KR | 20050115940 A | 12/2005 |
| KR | 20060050341 A | 5/2006 |
| KR | 20080077202 A | 8/2008 |
| KR | 20090081717 A | 7/2009 |
| KR | 20100120199 A | 11/2010 |
| KR | 101333631 B1 | 11/2013 |
| KR | 101415551 B1 | 7/2014 |
| KR | 20140097312 A | 8/2014 |
| KR | 101465640 B1 | 11/2014 |
| KR | 20150099400 A | 8/2015 |
| KR | 20160000400 A | 1/2016 |
| KR | 20160127717 A | 11/2016 |
| KR | 20170042359 A | 4/2017 |
| KR | 20170054239 A | 5/2017 |
| KR | 20180000291 A | 1/2018 |
| KR | 20180011711 A | 2/2018 |
| KR | 20190090283 A | 8/2019 |
| TW | 200402095 A | 2/2004 |
| TW | 201119524 A | 6/2011 |
| TW | 201525184 A | 7/2015 |
| TW | 201535453 A | 9/2015 |
| TW | 201535588 A | 9/2015 |
| WO | WO-2010087385 A1 | 8/2010 |
| WO | WO-2011099481 A1 | 8/2011 |
| WO | WO-2012087737 A2 | 6/2012 |
| WO | WO-2013162820 A1 | 10/2013 |
| WO | WO-2014057771 A1 | 4/2014 |
| WO | WO-2015105647 A1 | 7/2015 |
| WO | WO-2020010153 A1 | 1/2020 |

OTHER PUBLICATIONS

Final Office Action dated Apr. 30, 2020 issued in U.S. Appl. No. 15/612,423.

Final Office Action dated Mar. 25, 2021 issued in U.S. Appl. No. 15/612,423.

(56) References Cited

OTHER PUBLICATIONS

International Preliminary Report on Patentability dated Aug. 13, 2020 issued in Application No. PCT/US2019/015865.
International Preliminary Report on Patentability dated Dec. 12, 2019 issued in Application No. PCT/US2018/034998.
International Preliminary Report on Patentability dated Mar. 10, 2020 issued in Application No. PCT/US2018/049267.
International Preliminary Report on Patentability dated Oct. 1, 2020 issued in Application No. PCT/US2019/022046.
International Preliminary Report on Patentability issued on Feb. 2, 2021, in Application No. PCT/US2019/044113.
International Search Report and Written Opinion dated Jun. 28, 2019 issued in Application No. PCT/US2019/022046.
International Search Report and Written Opinion dated Mar. 14, 2019 issued in Application No. PCT/US2018/049267.
International Search Report and Written Opinion dated May 17, 2019 issued in Application No. PCT/US2019/015865.
International Search Report and Written Opinion dated Sep. 6, 2018 issued in Application No. PCT/US2018/034998.
International Search Report and Written Opinion issued on Dec. 19, 2019, in Application No. PCT/US2019/044113.
JP Office Action dated Jun. 14, 2022, in Application No. JP2019-566224 With English Translation.
Korean Office Action dated Jun. 7, 2021 issued in Application No. KR 10-2021-0056493.
KR Office Action and Search report dated Aug. 30, 2019 in Application No. KR10-2019-0073864 With English Translation.
KR Office Action dated Apr. 6, 2022, in Application No. KR1020217033272 with English translation.
KR Office Action dated Apr. 6, 2022, in Application No. KR1020217033273 with English translation.
KR Office Action dated Aug. 2, 2022 in Application No. KR10-2022-0034122 with English translation.
KR Office Action dated Aug. 30, 2019 in Application No. 10-2019-0073864.
KR Office Action dated Dec. 21, 2021, in Application No. KR10-2021-0056493 with English translation.
KR Office Action dated Mar. 23, 2022, in Application No. KR 10-2019-7037514 with English Translation.
KR Office Action dated May 6, 2022, in Application No. KR1020207000026.
KR Search Report (no translation provided) issued on Aug. 1, 2019, in Application No. 10- 2019-0073864.
Notice of Allowance dated Apr. 8, 2021 issued in U.S. Appl. No. 15/926,349.
Notice of Allowance dated Nov. 24, 2021 issued in U.S. Appl. No. 15/612,423.
Office Action dated Jan. 3, 2020 issued in U.S. Appl. No. 15/612,423.
Office Action dated Oct. 16, 2020 issued in U.S. Appl. No. 15/926,349.
Office Action dated Oct. 6, 2020 issued in U.S. Appl. No. 15/612,423.
PCT International Search Report and Written Opinion of the International Searching Authority issued in corresponding International Patent Application No. PCT/US2018/049267 on Dec. 26, 2018 (Forms PCT/ISA/220, 210, 237) (12 total pages).
SG Office Action dated Mar. 2, 2022, in Application No. SG11201911409S.
Singapore Notice of Eligibility and Examination Report dated Mar. 2, 2022 issued in Application No. SG 11201911409S.
Singapore Search Report and Written Opinion dated Feb. 2, 2021 issued in Application No. SG 11201911409S.
TW Office Action dated Oct. 22, 2021, in application No. TW107118835 with English translation.
US Final Office Action dated Jan. 19, 2022 issued in U.S. Appl. No. 15/696,068.
US Final Office Action dated Sep. 14, 2020 issued in U.S. Appl. No. 15/696,068.
U.S. Non-Final Office Action dated Jul. 28, 2022, in U.S. Appl. No. 17/369,694.
U.S. Notice of Allowance dated Jun. 1, 2022 in U.S. Appl. No. 15/696,068.
US Notice of Allowance issued on Jul. 23, 2021, issued in U.S. Appl. No. 16/052,877.
US Office Action dated Apr. 28, 2020 issued in U.S. Appl. No. 15/696,068.
US Office Action dated Jun. 30, 2021 issued in U.S. Appl. No. 15/696,068.
US Office Action issued on Apr. 15, 2021, issued in U.S. Appl. No. 16/052,877.
U.S. Restriction Requirement dated Jan. 24, 2020 in U.S. Appl. No. 15/696,068.
JP Office Action dated Oct. 18, 2022, in Application No. JP2019-566224 With English Translation.
KR Office Action dated Sep. 25, 2022 in Application No. KR10-2020-7000026 with English translation.
TW Office Action dated Sep. 30, 2022 In Application No. TW107130798 with English translation.
CN Office Action dated Feb. 28, 2023 in Application No. 201880057283.X with English translation.
CN Office Action dated Mar. 18, 2023, in Application No. CN201880036474.8 with English translation.
CN Office Action dated Oct. 9, 2023, in Application No. CN201980063428.1 with English translation.
JP Office Action dated Apr. 4, 2023, in Application No. JP2020-541696 with English translation.
JP Office Action dated Jun. 13, 2023 in Application No. JP2021-505710 with English translation.
JP Office Action dated Nov. 21, 2023 in JP Application No. 2021-505710, with English Translation.
KR Office Action dated Sep. 28, 2022 in Application No. KR10-2021-7032163 with English translation.
KR Office Action dated Apr. 6, 2022, in Application No. KR1020217032163 with English translation.
KR Office Action dated Apr. 27, 2023 in Application No. KR10-2020-7030025 with English translation.
KR Office Action dated Feb. 3, 2023 in Application No. KR10-2021-7032163 with English translation.
KR Office Action dated Feb. 3, 2023 in Application No. KR10-2021-7033272 with English translation.
KR Office Action dated Feb. 23, 2023 in Application No. KR10-2020-7000026 with English translation.
KR Office Action dated Feb. 27, 2023, in Application No. KR10-2020-7025028 with English translation.
KR Office Action dated Jan. 31, 2023 in Application No. KR10-2021-7033273 with English translation.
KR Office Action dated Jul. 20, 2023, in application No. KR10-2023-0039502 with English translation.
KR Office Action dated Jul. 21, 2023, in Application No. KR10-2022-7040239 with English Translation.
KR Office Action dated Jun. 26, 2023, in Application No. KR10-2020-7000026 with English translation.
KR Office Action dated May 16, 2023, in application No. KR10-2023-0039502 with English translation.
KR Office Action dated Nov. 27, 2023 in KR Application No. 10-2020-7030025 with English Translation.
KR Office Action dated Sep. 26, 2022 in Application No. KR10-2021-7033273 with English translation.
KR Office Action dated Sep. 27, 2022, in Application No. KR10-2021-7033272 with English translation.
KR Office Action dated Sep. 27, 2023, in application No. KR10-2020-7025028 with English translation.
KR Search Report issued on Aug. 1, 2019, in Application No. 10-2019-0073864 with English translation.
Merriam-Webster Dictionary definition of "distal" retrieved from Merriam-Webster.com (Year: 2023).
Schwartz, M., "Encyclopedia and Handbook of Materials, Parts, and Finishes", 3rd Edition, Glass-Ceramics Taylor & Francis, 2016, 27 pages.
TW Office Action dated Aug. 15, 2023, in application No. TW111140610 with English translation.
TW Office Action dated Aug. 18, 2023, in application No. TW107130798 with English translation.
TW Office Action dated May 30, 2023, in application No. TW108126884 with English translation.

(56) References Cited

OTHER PUBLICATIONS

U.S. Advisory Action dated Feb. 6, 2023 in U.S. Appl. No. 17/369,694.
U.S Advisory Action dated Oct. 23, 2023 in U.S. Appl. No. 16/966,833.
U.S. Corrected Notice of Allowance dated Sep. 27, 2023, in U.S. Appl. No. 17/369,694.
U.S. Final office Action dated Aug. 7, 2023 in U.S. Appl. No. 16/966,833.
U.S. Final office Action dated Nov. 21, 2022 in U.S. Appl. No. 17/369,694.
U.S. Non-Final office Action dated Jan. 20, 2023 in U.S. Appl. No. 17/652,243.
U.S. Non-Final Office Action dated Jan. 19, 2023 in U.S. Appl. No. 16/966,833.
U.S. Non-Final Office Action dated Mar. 7, 2023 in U.S. Appl. No. 17/369,694.
U.S. Notice of Allowance dated Jul. 11, 2023 in U.S. Appl. No. 17/652,243.
U.S. Notice of Allowance dated Jul. 25, 2023 in U.S. Appl. No. 17/369,694.
U.S. Notice of Allowance dated Nov. 3, 2023 in U.S. Appl. No. 17/369,694.
U.S. Notice of Allowance dated Oct. 17, 2023 in U.S. Appl. No. 17/652,243.
U.S. Appl. No. 18/481,886, inventors Gomm T A, et al., filed Oct. 5, 2023.
U.S. Appl. No. 18/490,265, inventors Topping S, et al., filed Oct. 19, 2023.
JP Office Action dated Apr. 16, 2024 in JP Application No. 2023-23008, with English Translation.
KR Office Action dated Mar. 28, 2024 in KR Application No. 10-2023-7014797, with English translation.
KR Office Action dated Mar. 28, 2024 in KR Application No. 10-2023-7033439 with English translation.
U.S. Appl. No. 18/637,111, inventors Vasquez M.B, et al., filed Apr. 16, 2024.
U.S. Notice of Allowance dated Jan. 18, 2024 in U.S. Appl. No. 16/966,833.
CN Office Action dated Jun. 24, 2024 in CN Application No. 201980011267.1 with English translation.
CN Office Action dated Jun. 24, 2024 in CN Application No. 201980020652.2 with English translation.
CN Office Action dated May 9, 2024 in CN Application No. 201980063428.1, with English Translation.
EP Extended European Search Report dated Dec. 5, 2023 in EP Application No. 23173104.3.
EP Extended European Search report dated Feb. 8, 2021 in EP Application No. 18809325.6.
International Preliminary Report on Patentability and Written Opinion dated Dec. 12, 2019 in PCT Application No. PCT/US2018/034998.
International Search Report and Written Opinion dated Aug. 20, 2024 in PCT Application No. PCT/US2024/027101.
International Search Report and Written Opinion dated Sep. 6, 2018 in PCT Application No. PCT/US2018/034998.
KR Office Action dated Aug. 26, 2024 in KR Application No. 10-2020-7030025, with English Translation.
TW Notice of Allowances dated Aug. 2, 2024 in TW Application No. 112143249 with English translation.
U.S. Non-Final Office Action dated May 9, 2024 in U.S. Appl. No. 17/451,975.
U.S. Non-Final Office Action dated May 23, 2024 in U.S. Appl. No. 18/481,886.
U.S. Notice of Allowance dated Sep. 19, 2024 in U.S. Appl. No. 17/451,975.
CN Office Action dated Dec. 16, 2024 in CN Application No. 201980011267.1, with English Translation.
CN Office Action dated Dec. 25, 2024 in CN Application No. 201980020652.2, with English Translation.
JP Office Action dated Dec. 24, 2024 in JP Application No. 2024-35429, with English Translation.
JP Office Action dated Oct. 29, 2024 in JP Application No. 2023-23008 with English translation.
KR Office Action dated Dec. 24, 2024 in KR Application No. 10-2023-7014797, with English Translation.
KR Office Action dated Dec. 26, 2024 in KR Application No. 10-2020-7030025, with English Translation.
KR Office Action dated Nov. 28, 2024 in KR Application No. 10-2023-7033439, with English Translation.
U.S. Corrected Notice of Allowance dated Dec. 30, 2024 in U.S. Appl. No. 17/451,975.
U.S. Non-Final Office Action dated Nov. 19, 2024 in U.S. Appl. No. 18/481,886.
U.S. Appl. No. 18/983,055, inventors French D et al., filed on Dec. 16, 2024.

* cited by examiner

HIGH TEMPERATURE RF CONNECTION WITH INTEGRAL THERMAL CHOKE

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

The latest generation of plasma enhanced chemical vapor deposition (PECVD) processes require increased high frequency electrical power. This increased power requirement exceeds the limits of existing electrical connectors and conductors. High ambient temperatures and heating from electrical current traveling through conductors and connections contribute to create a temperature condition in excess of the capabilities of commonly used components.

The electrical connections for some current PECVD processes use screw threads and preloaded spring washers. One limitation of threaded electrical connections is that the threads provide a poor, non-repeatable electrical contact area. This causes more electrical resistive heating of the connection. Another limitation of threaded electrical connections is that the threads of the radio frequency (RF) pedestal rod are extremely fragile and can be tightened with just a light torque, otherwise the threads are damaged. This light torque cannot provide the electrical contact needed for a high power electrical connection.

Other commercially available electrical connectors rely on spring force to make the electrical contact. These connectors can be used at temperatures up to about 150 to 200 degrees Celsius. In PECVD processes requiring increased high frequency power, the environment in which the electrical connector must function can be in the range from 300 to 350 degrees Celsius because a ceramic pedestal is typically used in such processes.

It is in this context that embodiments arise.

SUMMARY

In an example embodiment, a thermal choke rod for use in connecting a radio frequency (RF) source to a substrate support of a plasma processing system includes a tubular member having a first connector for connecting to an RF rod that is coupled to the substrate support and a second connector for connecting to an RF strap that couples to the RF source. A tubular segment, which has an inner diameter, extends between the first and second connectors. The first connector has an inner surface that is a continuation of an inner surface of the tubular segment, with the first connector having a conically-shaped end region that tapers away from the inner surface of the first connector to an outer surface of the first connector in a direction toward the tubular segment. The first connector has a plurality of slits formed through a wall thickness of the first connector along a prescribed distance from a terminal end of the first connector. An outer surface of the tubular segment has a threaded region proximate to the first connector for threaded engagement with an annular cap configured to fit over the first connector and reduce an inner diameter of the first connector upon contact with the conically-shaped end region of the first connector.

In one embodiment, the annular cap has an inner threaded region for threaded engagement with the threaded region proximate to the first connector, and an inner tapered wall that is configured to mate with the conically-shaped end region of the first connector. In one embodiment, the second connector has an inner threaded region and the thermal choke rod further includes a threaded mechanical fastener that is configured to connect the RF strap to the second connector of the thermal choke rod. In one embodiment, the threaded mechanical fastener is either a bolt or a machine screw.

In one embodiment, the thermal choke rod is formed of a base material having a low thermal conductivity, and the base material is plated with a highly electrically conductive material. In one embodiment, the base material having a low thermal conductivity comprises stainless steel or a nickel-chromium-based superalloy, and the highly electrically conductive material plated on the base material comprises gold.

In another example embodiment, a plasma processing system is provided. The plasma processing system includes a radio frequency (RF) input rod having a first end connected to a plasma processing chamber and a second end for receiving RF signals from an RF source. The system also includes a thermal choke rod having a first connector, a second connector, and a tubular segment extending between the first and second connectors. The first connector has an inner surface that is a continuation of an inner surface of the tubular segment. Further, the first connector has a conically-shaped end region that tapers away from the inner surface of the first connector to an outer surface of the first connector in a direction toward the tubular segment. The first connector also has a plurality of slits formed through a wall thickness of the first connector along a prescribed distance from a terminal end of the first connector. An outer surface of the tubular segment has a threaded region proximate to the first connector. The first connector is configured to receive the second end of the RF input rod, and the second connector is configured to connect to an RF strap. An annular cap is configured to fit over the first connector and reduce an inner diameter of the first connector upon contact with the conically-shaped end region of the first connector. The system also includes an RF source coupled to the RF strap.

In one embodiment, the plasma processing chamber includes a processing region, and the plasma processing system further includes a substrate support disposed in the chamber below the processing region. In this embodiment, the RF input rod is coupled to the substrate support.

In one embodiment, the annular cap has an inner threaded region for threaded engagement with the threaded region proximate to the first connector, and an inner tapered wall that is configured to mate with the conically-shaped end region of the first connector. In one embodiment, the second connector has an inner threaded region and the thermal choke rod further includes a threaded mechanical fastener that is configured to connect the RF strap to the second connector of the thermal choke rod. In one embodiment, the threaded mechanical fastener is either a bolt or a machine screw.

In one embodiment, the thermal choke rod is formed of a base material having a low thermal conductivity, and the base material is plated with a highly electrically conductive material. In one embodiment, the base material having a low thermal conductivity comprises stainless steel or a nickel-chromium-based superalloy, and the highly electrically conductive material plated on the base material comprises gold.

In yet another example embodiment, a method for connecting a radio frequency (RF) source to a plasma processing chamber is provided. The method includes providing a thermal choke rod having a first connector, a second connector, and a tubular segment extending between the first and second connectors, with the first connector having an inner surface that is a continuation of an inner surface of the tubular segment. The method also includes inserting a first end portion of a radio frequency (RF) input rod into the first connector of the thermal choke rod and positioning the first end portion of the RF input rod at a prescribed location within the thermal choke rod, with the RF input rod having a second end portion coupled to a plasma processing chamber. Further, the method includes compressing the first connector to reduce an inner diameter of the first connector and cause an inner surface of the first connector to contact and press upon an outer surface of the RF input rod so as to be mechanically secured to the RF input rod. The method also includes attaching a radio frequency (RF) strap to the second connector of the thermal choke rod, with the RF strap being coupled to an RF source.

In one embodiment, the providing of the thermal choke rod includes providing a thermal choke rod comprised of a base material having a low thermal conductivity, and the base material is plated with a highly electrically conductive material. In one embodiment, the base material having a low thermal conductivity comprises stainless steel or a nickel-chromium-based superalloy, and the highly electrically conductive material plated on the base material comprises gold.

In one embodiment, the compressing of the first connector to reduce an inner diameter of the first connector includes contacting a tapered surface provided at an end region of the first connector with a tapered surface that is configured to mate with the tapered surface provided at the end region of the first connector. In one embodiment, the tapered surface that is configured to mate with the tapered surface provided at the end region of the first connector is an inner surface of an annular cap configured to fit over the first connector.

In one embodiment, the prescribed location within the thermal choke rod at which the first end portion of the RF input rod is positioned includes the first connector and a portion of the tubular segment. In one embodiment, the attaching of the RF strap to the second connector of the thermal choke rod includes attaching a mechanical fastener to the second connector of the thermal choke rod.

Other aspects and advantages of the disclosures herein will become apparent from the following detailed description, taken in conjunction with the accompanying drawings, which illustrate by way of example the principles of the disclosures.

DETAILED DESCRIPTION

In the following description, numerous specific details are set forth in order to provide a thorough understanding of the example embodiments. However, it will be apparent to one skilled in the art that the example embodiments may be practiced without some of these specific details. In other instances, process operations and implementation details have not been described in detail, if already well known.

Embodiments of the present invention provide a thermal choke rod having a collet connection that provides a strong clamping force for electrically connecting a radio frequency (RF) input rod to an RF source. The thermal choke rod also serves to isolate the high heat generated by the pedestal and electrical current resistive heating from sensitive electrical components located upstream. This thermal functionality is accomplished by forming the thermal choke rod from a base material having a low thermal conductivity and the capability to withstand high temperatures. To provide the thermal choke rod with the electrical conductivity needed to conduct electrical power, the base material is used in conjunction with a highly electrically conductive material, which, in one embodiment, is plated on the base material.

Figure 1:
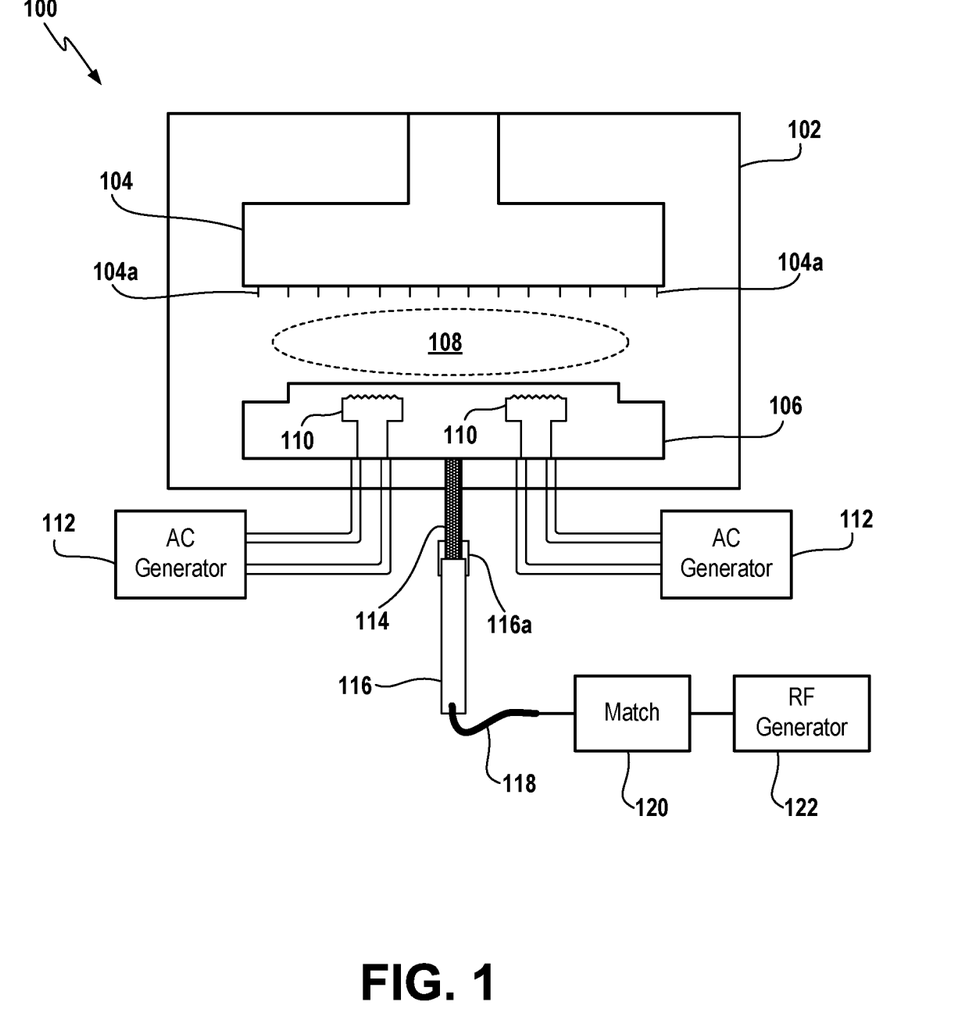
FIG. 1 is a simplified schematic cross-sectional diagram showing a plasma processing system used for deposition operations, in accordance with one embodiment.

FIG. 1 is a simplified schematic cross-sectional diagram showing a plasma processing system used for deposition operations, in accordance with one embodiment. The plasma processing system 100 includes a chamber 102 in which a gas distribution showerhead 104, which has a plurality of openings 104a through which process gases can flow, and a substrate support 106 are disposed. The chamber 102 has a processing region 108 that is located between the showerhead 104 and the substrate support 106. For a plasma enhanced chemical vapor deposition (PECVD) process, the substrate support 106 can be a pedestal for supporting a substrate, e.g., a wafer, during deposition. Heaters 110 are provided in the substrate support 106 to heat the substrate, with each heater being coupled to an alternating current (AC) generator. One end portion of radio frequency (RF) input rod 114 is coupled to substrate support 106 to provide RF power to an electrode that forms part of the substrate support, e.g., pedestal. The other end portion of RF input rod 114 is connected to a thermal choke rod 116, which includes an annular cap 116a. Additional details regarding the thermal choke rod are described below with reference to FIGS. 2, 3A-B, 4A-B, and 5.

A radio frequency (RF) strap 118 is also connected to thermal choke rod 116. The RF strap 118 is coupled to impedance matching network 120 via a suitable wire connector. Radio frequency (RF) generator system 122, which includes one or more RF generators, is coupled to impedance matching network 120 via a suitable wire connector. In operation, RF generator system 122 generates an RF signal that is transmitted to an input of impedance matching network 120. The impedance matching network 120 matches the impedance of a load coupled to an output of the matching network with the impedance of a source coupled to an input of the matching network and generates a modified RF signal. The modified RF signal is transmitted from the impedance matching network 120 to the thermal choke rod 116 via the wire connector and the RF strap 118. The modified RF signal (RF current) is then conducted, for the most part, along the outer surface of the thermal choke rod 116 and is transmitted to the RF input rod 114 via the electrical connection created where the thermal choke rod contacts the RF input rod, as will be explained in more detail below with reference to FIGS. 2, 3A, and 3B.

Figure 2:
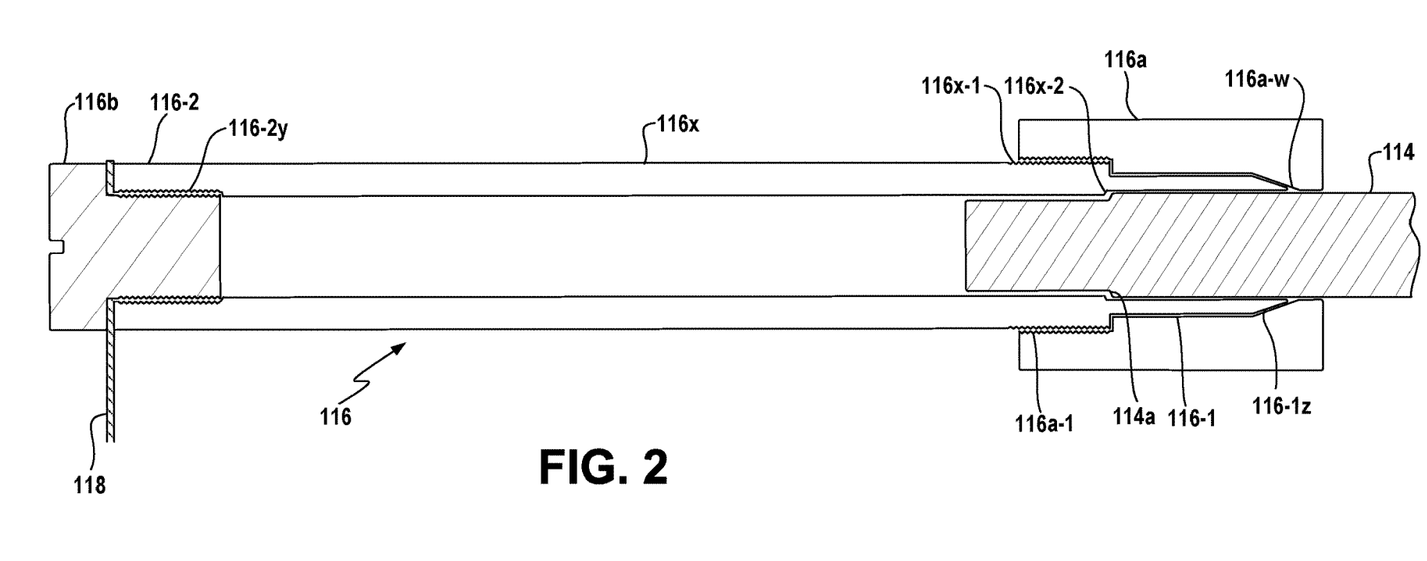
FIG. 2 is a cross-sectional view of a thermal choke rod in the process of being connected to an RF input rod, in accordance with one embodiment.

FIG. 2 is a cross-sectional view of a thermal choke rod in the process of being connected to an RF input rod, in accordance with one embodiment. As shown in FIG. 2, thermal choke rod 116 includes a first connector 116-1, a second connector 116-2, and a tubular segment 116x that extends between the first and second connectors. The tubular segment 116x has an inner diameter. In one embodiment, the inner diameter is in the range from about 0.125 inch to about 0.156 inch. As used herein, the terms "about" and "approximately" mean that the specified parameter can be varied within a reasonable tolerance, e.g., ±20%. The inner surface of the first connector 116-1 is a continuation of the inner surface of the tubular segment 116x. In one embodiment, the inner diameter of the first connector 116-1 is smaller than the inner diameter of the tubular segment 116x. This allows for a tight tolerance, locally-machined area in the interface zone, and also provides for a step that indicates when the thermal choke rod is fully slid onto the RF input rod, as described in more detail below. The wall thickness of the first connector 116-1 is reduced relative to the wall thickness of the tubular segment 116x. In one embodiment, the wall thickness of the tubular segment 116x is approximately 0.250 inch and the wall thickness of the first connector 116-1 is approximately 0.205 inch. The reduced wall thickness of the first connector 116-1 enables the inner diameter of the first connector to be reduced by the application of a compressive force, as will be described in more detail below.

The end region of the first connector 116-1 has a conical shape that tapers away from the inner surface of the first connector to an outer surface of the first connector in a direction toward the tubular segment 116x. In one embodiment, the surface 116-1z of the conically-shaped end region is disposed at an angle of about 10 degrees to about 30 degrees relative to a horizontal reference line. To enable threaded engagement with annular cap 116a, the outer surface of the tubular segment 116x is provided with a threaded region 116x-1 proximate or near to the first connector 116-1. In the example of FIG. 2, the threaded region 116x-1 is adjacent to the first connector 116-1. In other embodiments, the threaded region 116x-1 can be separated from the first connector 116-1 by a prescribed distance.

The annular cap 116a is configured to fit over the first connector 116-1 and reduce the inner diameter thereof to create a firm connection between the first connector and the RF input rod 114. The annular cap 116a has an inner threaded region 116a-1 for threaded engagement with the threaded region 116x-1 on the outer surface of tubular segment 116x. The annular cap 116a also has an inner tapered wall 116a-w that is configured to mate with the surface 116-1z of the conically-shaped end region of the first connector 116-1. In one embodiment, the inner tapered wall 116a-w is disposed at an angle of about 10 degrees to about 30 degrees relative to a horizontal reference line.

To connect the RF input rod 114 to the thermal choke rod 116, the RF input rod is inserted through the central opening of the annular cap 116a while the annular cap is either separated from the thermal choke rod or is loosely threaded over the first connector 116-1. An end portion of the RF input rod 114 is then inserted into the first connector 116-1 and positioned at a prescribed location within the thermal choke rod. In the example shown in FIG. 2, the prescribed location of the end portion of the RF input rod 114 includes the first connector 116-1 and a portion of the tubular segment 116x. In one embodiment, there is a step 114a in the outer diameter of the end portion of the RF input rod 114 and a step 116x-2 in the inner diameter of the tubular segment 116x. In this embodiment, the step 116x-2 acts as a locating stop for the insertion depth of the RF input rod 114. With the RF input rod 114 disposed at the prescribed location within the thermal choke rod 116, the annular cap 116a is then threaded onto the threaded region 116x-1 on the outer surface of tubular segment 116x. As the annular cap 116a is moved from an initial engagement position to a fully engaged position, the inner tapered wall 116a-w of the annular cap contacts the surface 116-1z of the conically-shaped end region of the first connector 116-1. This contact causes a compressive force to be exerted on the first connector 116-1 that reduces the inner diameter of the first connector. As the inner diameter of the first connector 116-1 is reduced, a portion of the inner surface of the first connector is brought into contact with and pressed upon the outer surface of the RF input rod 114 to mechanically secure the first connector to the RF input rod. Additional details regarding the process of connecting the RF input rod to the thermal choke rod are described below with reference to FIGS. 3A, 3B, 5, and 6.

With continuing reference to FIG. 2, second connector 116-2 has an inner threaded region 116-2y for threaded engagement with a threaded mechanical fastener 116b. The threaded mechanical fastener 116b can be any suitable fastener such as, for example, a bolt or a machine screw. The RF strap 118 can be attached to the second connector 116-2 of the thermal choke rod 116 by inserting the threaded mechanical fastener 116b through an opening in the RF strap and then threading the fastener into a fully engaged position in the threaded region 116-2y to firmly attach the RF strap to the second connector.

Figure 3A:
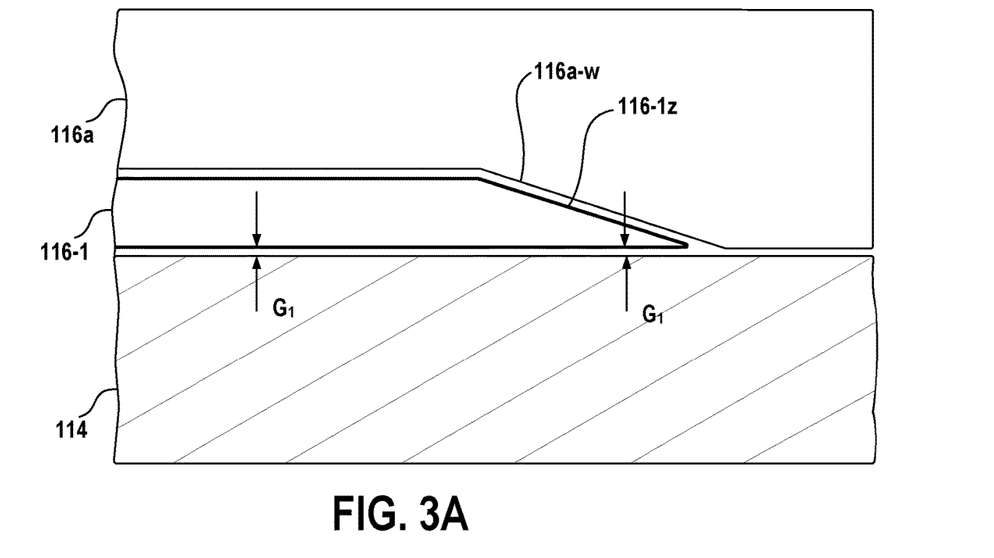
FIGS. 3A and 3B are enlarged cross-sectional views that illustrate the process of connecting the thermal choke rod to the RF input rod, in accordance with one embodiment.
Figure 3B:
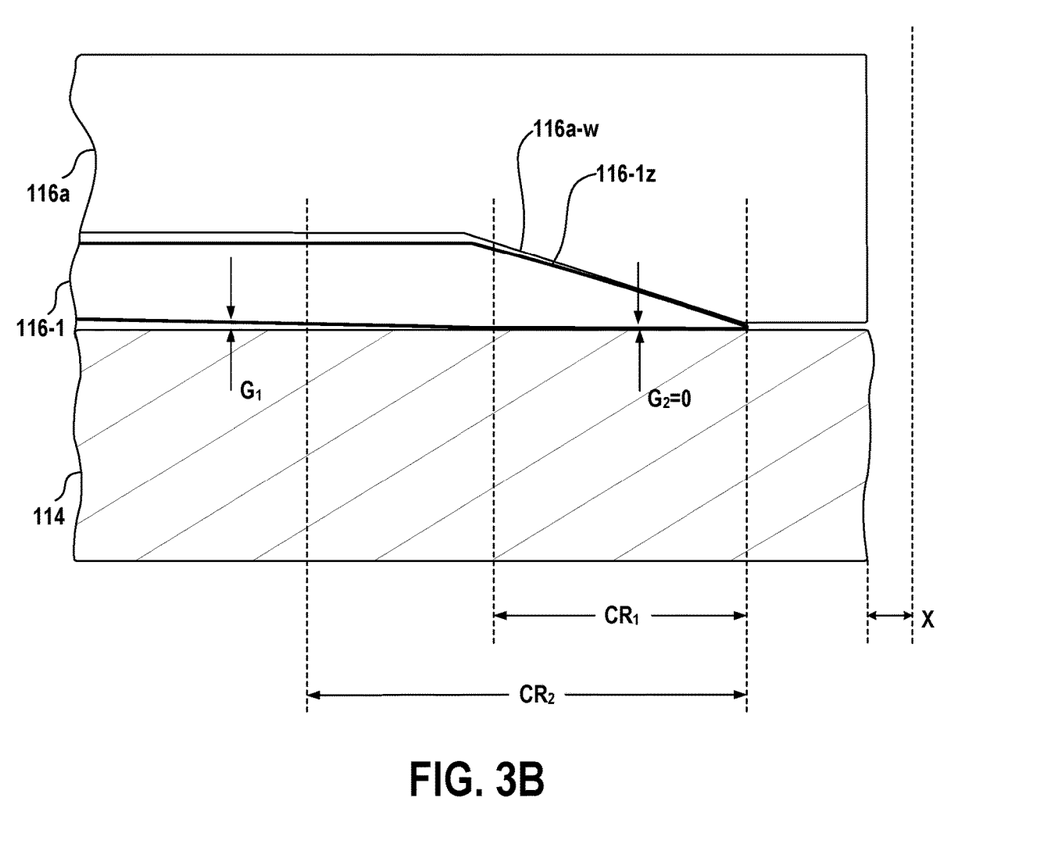

FIGS. 3A and 3B are enlarged cross-sectional views that illustrate the process of connecting the thermal choke rod to the RF input rod, in accordance with one embodiment. FIG. 3A shows the relative positions of the first connector 116-1, the annular cap 116a, and the RF input rod 114 before the annular cap reaches the fully engaged position. As shown in FIG. 3A, the inner tapered wall 116a-w of annular cap 116a has yet to contact the surface 116-1z of the conically-shaped end region of the first connector 116-1. In this state, there is a gap, $G_1$, between the outer surface of the RF input rod 114 and the inner surface of the first connector 116-1. FIG. 3B shows the relative positions of the first connector 116-1, the annular cap 116a, and the RF input rod 114 once the annular cap reaches the fully engaged position. As shown in FIG. 3B, the annular cap 116a has been moved by a distance, X, in the direction toward the first connector 116-1 (i.e., from right to left on the page) relative to the position of the annular cap shown in FIG. 3A, to bring the annular cap into the fully engaged position. In the fully engaged position, the inner tapered wall 116a-w contacts the surface 116-1z of the conically-shaped end region of the first connector 116-1 and exerts a compressive force on the first connector. This compressive force reduces the inner diameter of the first connector 116-1 and causes a portion of the inner surface of the first connector to contact and press upon the outer surface of the RF input rod 114. In the embodiment shown in FIG. 3B, the region in which the inner surface of first connector 116-1 and the outer surface of the RF input rod 114 are pressed into contact is labeled as $CR_1$, and in contact region $CR_1$ there is no gap between the inner surface of the first connector and the outer surface of the RF input rod. As such, as indicated in FIG. 3B, $G_2$ equals zero.

The length of the contact region in which the inner surface of the first connector 116-1 and the outer surface of the RF input rod 114 are pressed into contact can be varied by changing the size and shape of the conically-shaped end region of the first connector and making corresponding changes to the angle of the inner tapered wall 116a-w of the annular cap 116a. Thus, in other embodiments, the length of the contact region can be longer than the length of contact region $CR_1$ shown in FIG. 3B. For example, contact region $CR_2$ shown in FIG. 3B extends beyond the conically-shaped end region of the first connector 116-1.

Figure 4A:
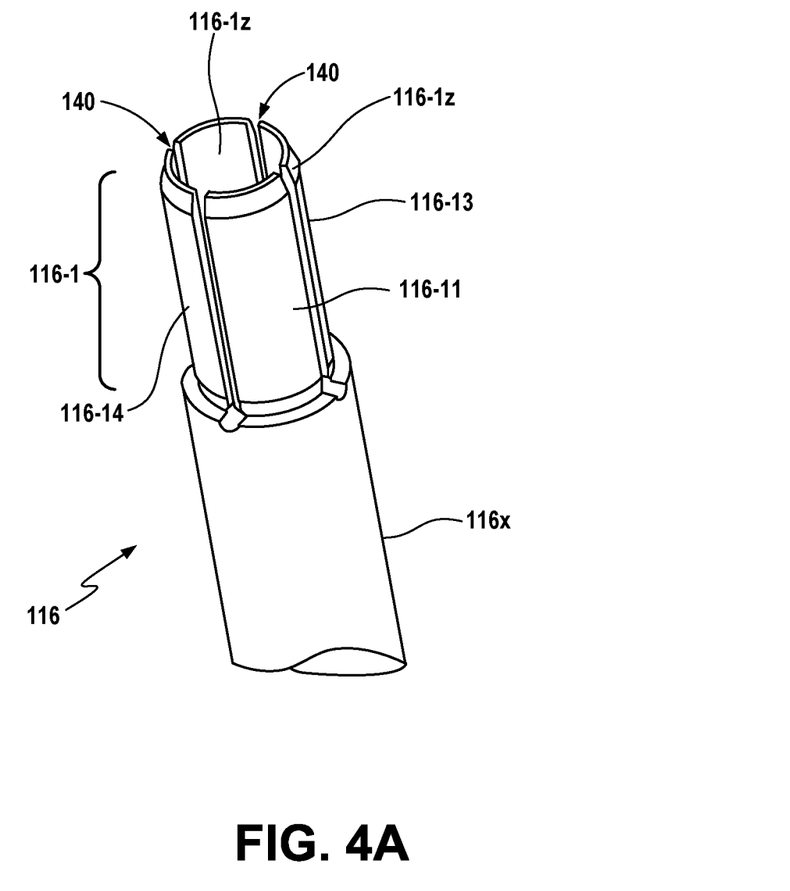
FIG. 4A is a partial perspective view of a thermal choke rod, in accordance with one embodiment.

FIG. 4A is a partial perspective view of a thermal choke rod, in accordance with one embodiment. The portion of the thermal choke rod 116 shown in FIG. 4A includes tubular segment 116x and first connector 116-1. For ease of illustration, the threaded portion 116x-1 on the outer surface of tubular segment 116x has been omitted from FIG. 4A. In the embodiment of FIG. 4A, a plurality of slits 140 is formed in first connector 116-1 to define axial fingers 116-11, 116-12, 116-13, and 116-14. The slits 140 extend for the length of first connector 116-1 but the slit length can be varied, as will be described below with reference to FIG. 4B. The axial fingers 116-11, 116-12, 116-13, and 116-14 are radially compressed when that annular cap is attached to the thermal choke rod, in the manner described above, to exert a strong clamping force against the RF input rod when the RF input rod is disposed with the first connector. In this manner, the axial fingers of the first connector function as a collet to hold the RF input rod securely within the thermal choke rod. The strong clamping force provided by radial compression of the axial fingers provides for improved electrical contact between the first connector of the thermal choke rod and the RF input rod.

Figure 4B:
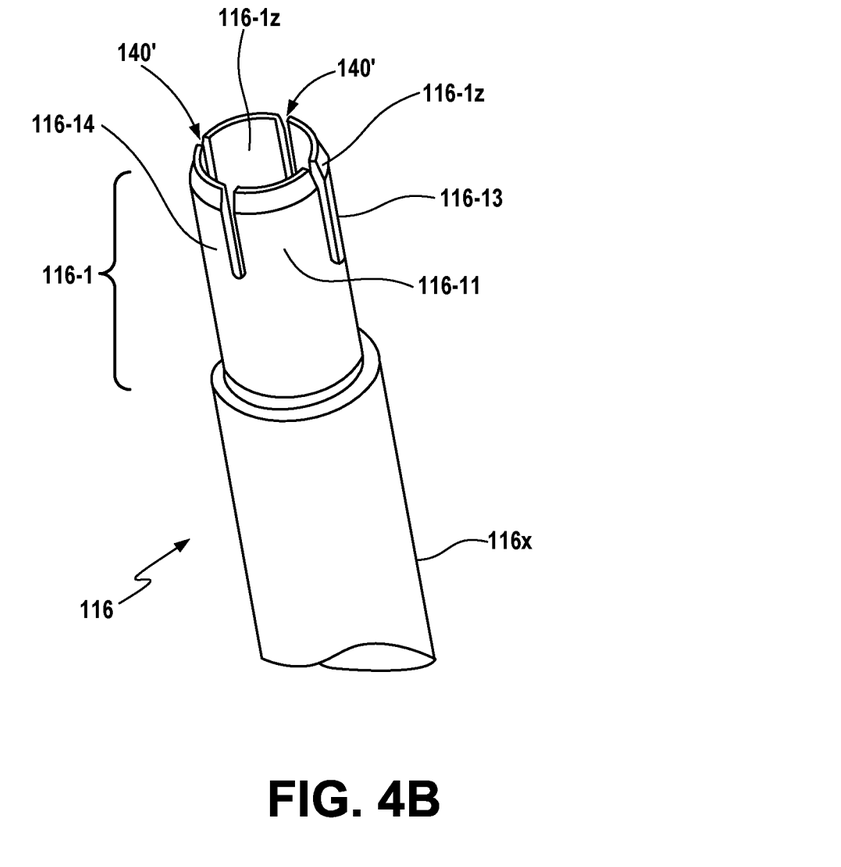
FIG. 4B is a partial perspective view of a thermal choke rod, in accordance with another embodiment.

FIG. 4B is a partial perspective view of a thermal choke rod, in accordance with another embodiment. The portion of the thermal choke rod 116 shown in FIG. 4B includes tubular segment 116x and first connector 116-1. For ease of illustration, the threaded portion 116x-1 on the outer surface of tubular segment 116x has been omitted from FIG. 4B. The embodiment shown in FIG. 4B is the same as the embodiment shown in FIG. 4A, except for the length of the slits formed in the first connector. As shown in FIG. 4B, the slits 140' extend for a portion of the length of the first connector 116-1, as opposed to extending for the length of the first connector as shown in FIG. 4A. In one embodiment, the slits 140' extend for about one quarter (25%) to about one third (33%) of the length of the first connector 116-1. In other embodiments, the slits 140' can extend for a longer distance, e.g., about 40%, 50%, 60%, etc. of the length of the first connector, or a shorter distance, e.g., about 10%, 20%, etc. of the length of the first connector. The slits 140' formed in the first connector 116-1 should extend for a length that is sufficient to enable the axial fingers 116-11, 116-12, 116-13, and 116-14 to be radially compressed against the RF input rod when the annular cap is attached to the thermal choke rod. On the other hand, the length of the slits should not be so long that the axial fingers defined by the slits are prone to bending or other deformation that might limit the lifetime of the thermal choke rod.

Figure 5:
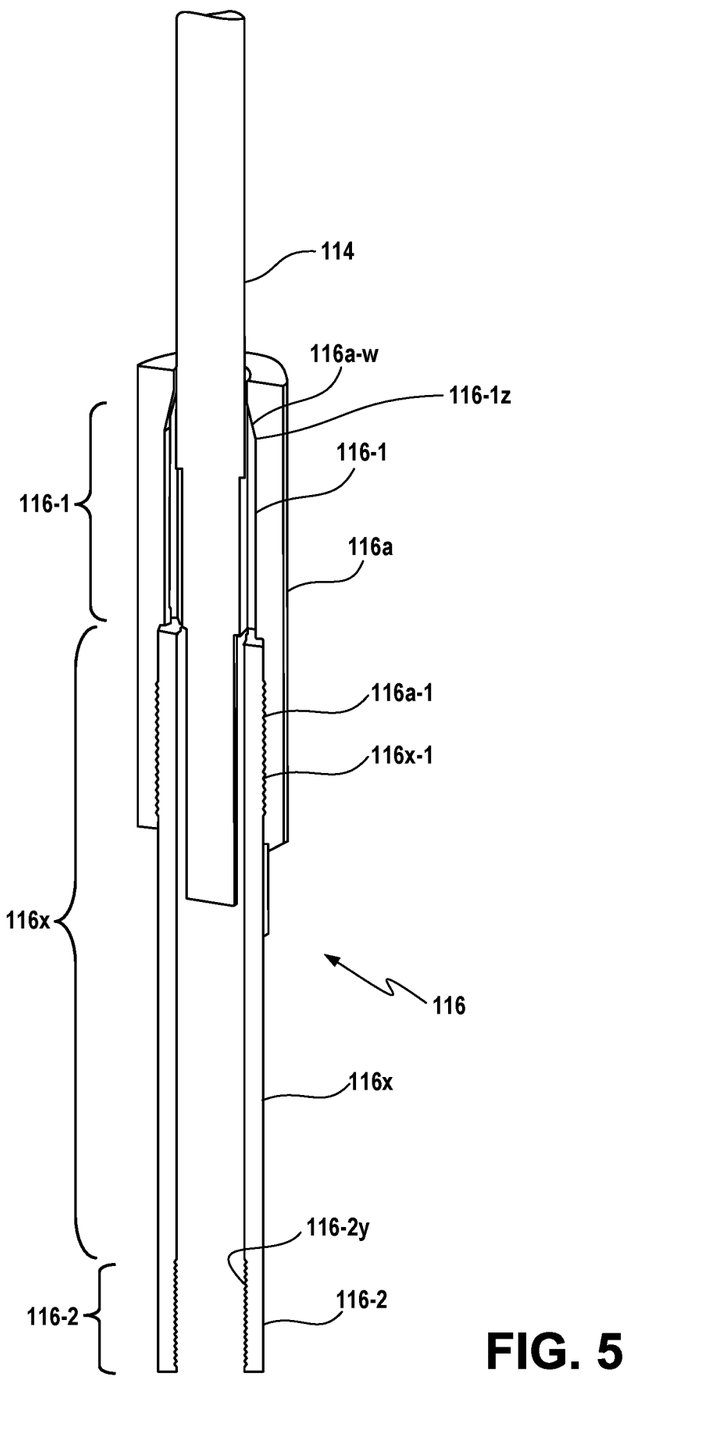
FIG. 5 is a cutaway perspective view that illustrates an RF input rod connected to the thermal choke rod, in accordance with one embodiment.

FIG. 5 is a cutaway perspective view that illustrates an RF input rod connected to the thermal choke rod, in accordance with one embodiment. As shown in FIG. 5, RF input rod 114 extends through the annular opening in annular cap 116a and into the thermal choke rod 116 so that an end portion of the RF input rod is situated within tubular segment 116x. The annular cap 116a has been fit over first connector 116-1 and the inner threaded region 116a-1 has been brought into threaded engagement with threaded region 116x-1 on the outer surface of tubular segment 116x so that the annular cap is in the fully engaged position. With the annular cap 116a in the fully engaged position, the inner tapered wall 116a-w contacts the surface 116-1z of the conically-shaped end region of the first connector 116-1 and exerts a compressive force on the first connector. This compressive force causes a portion of the inner surface of the first connector 116-1 to contact and press upon the outer surface of the RF input rod 114, as described above with reference to FIGS. 3A and 3B. The strong clamping force provided by radial compression of the first connector 116-1 provides for improved electrical contact between the first connector of the thermal choke rod 116 and the RF input rod 114.

The brackets shown on the left side of FIG. 5 indicate the various sections of the thermal choke rod 116. These sections include the first connector 116-1, the second connector 116-2, and the tubular segment 116x that extends between the first and second connectors. The second connector 116-2 includes an inner threaded region 116-2y for threaded engagement with a threaded mechanical fastener (see, for example, threaded mechanical fastener 116b shown in FIG. 2) that secures an RF strap to the second connector.

In addition to providing improved electrical contact with the RF input rod, the thermal choke rod also serves to isolate the high heat generated by the pedestal and electrical current resistive heating from sensitive electrical components located upstream. This thermal functionality is accomplished by forming the thermal choke rod from a base material which has a low thermal conductivity and is capable of withstanding high temperatures. In one embodiment, the base material having a low thermal conductivity is formed of stainless steel or a nickel-chromium-based superalloy. Examples of these materials include Type 316L stainless steel and superalloys commercially available under the trade names INCONEL®, HAYNES®, and HASTELLOY®. In one embodiment, the base material is chosen to match the thermal mechanical properties, e.g., coefficient of thermal expansion, of the RF input rod. By matching the coefficients of thermal expansion, the risk of the connection between the thermal choke rod and the RF input rod becoming loosened at high temperatures is minimized. To further reduce heat transfer, the thermal choke rod is configured to minimize the cross-sectional area of the component.

The electrically conductive components typically used in electrical power delivery are also highly thermally conductive. To provide the thermal choke rod with the electrical conductivity needed to conduct electrical power, the base material is used in conjunction with a highly electrically conductive material, e.g., gold. In one embodiment, the highly electrically conductive material is plated on the base material. As RF current is conducted largely on the surface of a conductor, the use of a plating material provides the thermal choke rod with the needed RF conductivity, while maintaining the desirable thermal properties of the base material. With regard to the ability to withstand high temperatures, the conductive plating is the limiting factor because the base material can withstand extremely high temperatures. A conductive plating of gold is believed to be able to withstand high temperatures up to about 400 degrees Celsius, which exceeds the temperature range of 300 to 350 degrees Celsius at which the thermal choke rod must function when used in conjunction with ceramic pedestals in high frequency power environments.

Figure 6:
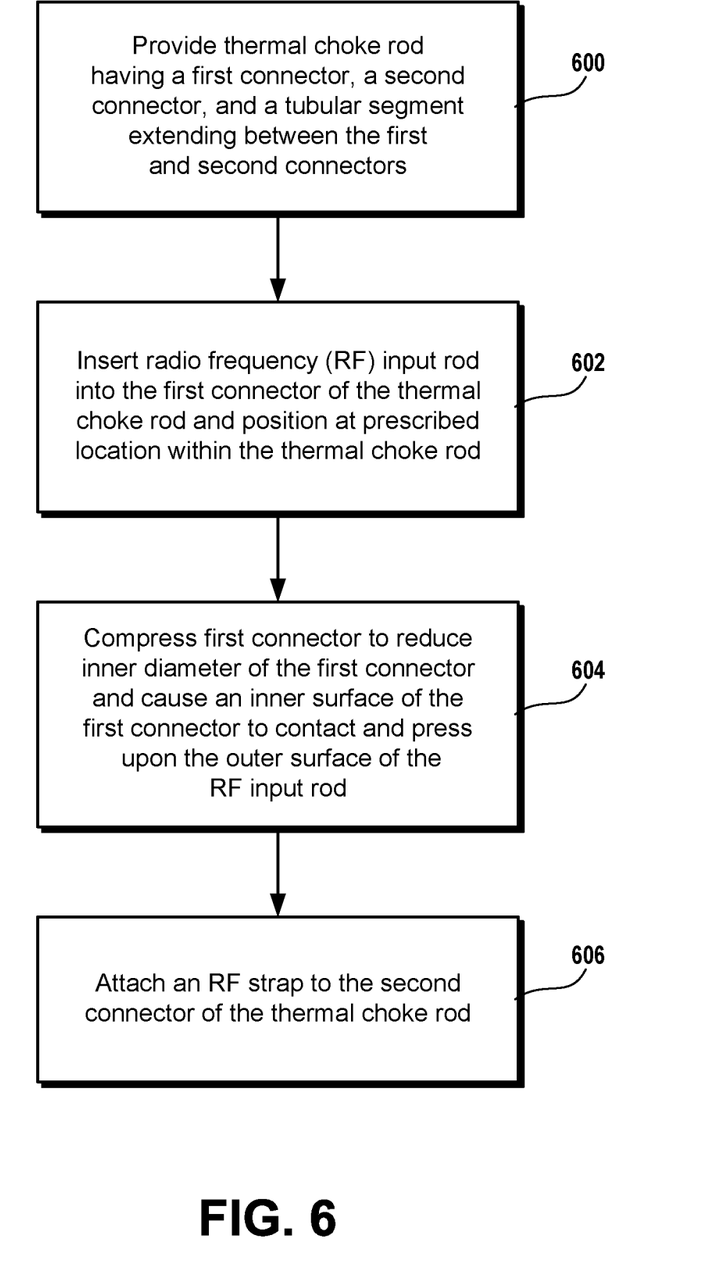
FIG. 6 is a flow diagram illustrating the method operations performed in connecting a radio frequency (RF) source to a plasma processing chamber, in accordance with an example embodiment.

FIG. 6 is a flow diagram illustrating the method operations performed in connecting a radio frequency (RF) source to a plasma processing chamber, in accordance with an example embodiment. In operation 600, a thermal choke rod having a first connector, a second connector, and tubular segment extending between the first and second connectors is provided. In one embodiment, the thermal choke rod has the configuration of thermal choke rod 116 shown in, for example, FIG. 2. In one embodiment, the thermal choke rod is formed of a base material having low thermal conductivity and the base material is plated with a highly electrically conductive material. By way of example, the base material having a low thermal conductivity can be comprised of stainless steel or a nickel-chromium-based superalloy, as described above. In one embodiment, the highly electrically conductive material plated on the base material is comprised of gold.

In operation 602, a first end portion of an RF input rod is inserted into the first connector of the thermal choke rod and positioned at a prescribed location within the thermal choke rod. The second end portion of the RF input rod is coupled to a plasma processing chamber, e.g., a plasma enhanced chemical vapor deposition (PECVD) chamber. In one embodiment, the prescribed location within the thermal choke rod at which the first end portion of the RF input rod is positioned includes the first connector and a portion of the tubular segment, as shown in, for example, FIGS. 2 and 5.

Once the first end portion of the RF input rod is positioned within the thermal choke rod, in operation 604, the first connector is compressed to reduce the inner diameter of the first connector and cause the inner surface of the first connector to contact and press upon the outer surface of the RF input so as to be mechanically secured to the RF input rod. In one embodiment, the compressing of the first connector to reduce an inner diameter of the first connector includes contacting a tapered surface provided at an end region of the first connector with a tapered surface that is configured to mate with the tapered surface provided at the end region of the first connector. By way of example, the tapered surface provided at an end region of the first connector can be the surface 116-1*z* of the conically-shaped end region of first connector 116-1 (see, for example, FIG. 2). In one embodiment, the tapered surface that is configured to mate with the tapered surface provided at the end region of the first connector is tapered inner wall 116*a-w* of annular cap 116*a* (see, for example, FIGS. 2 and 5).

In operation 606, an RF strap is connected to the second connector of the thermal choke rod. The RF strap is coupled to an RF source such as, for example, RF generator system 122 shown in FIG. 1. In one embodiment, the attaching of the RF strap to the second connector of the thermal choke rod includes attaching a mechanical fastener to the second connector of the thermal choke rod. By way of example, the mechanical fastener can be a threaded mechanical fastener such as a bolt or a machine screw. In one embodiment, as shown in FIG. 2, the RF strap 118 can be attached to the second connector 116-2 of the thermal choke rod 116 by inserting the threaded mechanical fastener 116*b* through an opening in the RF strap and then threading the fastener into a fully engaged position in the threaded region 116-2*y* to firmly attach the RF strap to the second connector.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Accordingly, the disclosure of the example embodiments is intended to be illustrative, but not limiting, of the scope of the disclosures, which are set forth in the following claims and their equivalents. Although example embodiments of the disclosures have been described in some detail for purposes of clarity of understanding, it will be apparent that certain changes and modifications can be practiced within the scope of the following claims. In the following claims, elements and/or steps do not imply any particular order of operation, unless explicitly stated in the claims or implicitly required by the disclosure.

The invention claimed is:

1. A thermal choke member of a plasma processing system, the thermal choke member comprising:
a first connector configured to connect to an RF input rod of the plasma processing system, wherein the RF input rod is coupled to an electrode of a substrate support of the plasma processing system, wherein the first connector has an inner surface and an outer surface to define a wall thickness, wherein the wall thickness tapers at an end region of the first connector to a terminal end of the first connector;
a second connector configured to connect to an RF strap that couples to an RF source, wherein the RF source is configured to provide an RF signal to the RF input rod via the thermal choke member; and
a segment that extends between the first connector and the second connector, wherein the first connector has the inner surface that is a continuation of an inner surface of the segment, wherein an inner diameter of the first connector is less than an inner diameter of the segment, wherein the first connector has a plurality of slits formed through the wall thickness of the first connector, the plurality of slits at the terminal end of the first connector and extending contiguously a prescribed distance from the terminal end of the first connector to define a plurality of axial fingers.

2. The thermal choke member of claim 1, wherein the thermal choke member thermally isolates the RF input rod from the RF strap and provides electrical interconnection between the RF strap and the RF input rod.

3. The thermal choke member of claim 1, wherein the first connector tapers away from the inner surface of the first connector at the terminal end to the outer surface of the first connector in a direction toward the segment.

4. The thermal choke member of claim 3, wherein the first connector tapers away from the inner surface to the outer surface at an angle between 10 degrees and 30 degrees relative to a horizontal reference line.

5. The thermal choke member of claim 1, wherein an outer surface of the segment has a threaded region proximate to the first connector, wherein the threaded region is configured for engagement with an annular cap.

6. The thermal choke member of claim 5, wherein the annular cap is configured to fit over the first connector and is further configured to reduce the inner diameter of the first connector in response to contact between the annular cap and at least a portion of the first connector.

7. The thermal choke member of claim 5, wherein the prescribed distance of the plurality of slits is sufficient to cause the plurality of axial fingers to be radially compressed against the RF input rod in response to contact between the annular cap and at least a portion of the first connector.

8. The thermal choke member of claim 1, wherein a base material of the thermal choke member comprises stainless steel or nickel-chromium-based superalloy, wherein an electrically conductive material is plated on the base material, wherein the conductive material comprises gold.

9. The thermal choke member of claim 1, wherein the RF strap is connected to the second connector by a mechanical fastener.

10. The thermal choke member of claim 1, wherein the prescribed distance of the plurality of slits extends for 20% to 40% of a length of the first connector.

11. A plasma processing system comprising:
an RF source configured to transmit RF signals;
an RF input rod having a first end connected to a plasma processing chamber and a second end configured to receive the RF signals from the RF source;
an RF strap coupled to the RF source; and
a thermal choke member comprising:
 a first connector connected to the RF input rod, wherein the first connector has an inner surface and an outer surface to define a wall thickness, wherein the wall thickness tapers at an end region of the first connector to a terminal end of the first connector;
 a second connector connected to the RF strap; and
 a segment that extends between the first connector and the second connector, wherein the first connector has the inner surface that is a continuation of an inner surface of the segment, wherein an inner diameter of the first connector is less than an inner diameter of the segment, wherein the first connector has a plurality of slits formed through the wall thickness of the first connector, the plurality of slits at a terminal end of the first connector and extending contiguously a prescribed distance from the terminal end of the first connector to define a plurality of axial fingers.

12. The plasma processing system of claim 11, further comprising:
a substrate support disposed in the plasma processing chamber, wherein the RF input rod is coupled to the substrate support.

13. The plasma processing system of claim 11, further comprising:
an annular cap over the first connector, wherein the annular cap is configured to reduce the inner diameter of the first connector in response to contact between the annular cap and at least a portion of the first connector.

14. The plasma processing system of claim 13, wherein the annular cap has an inner threaded region for threaded engagement with a region of the segment proximate to the first connector.

15. The plasma processing system of claim 13, wherein the prescribed distance of the plurality of slits is sufficient to cause the plurality of axial fingers to be radially compressed against the RF input rod in response to contact between the annular cap and at least a portion of the first connector.

16. The plasma processing system of claim 11, wherein the first connector tapers away from the inner surface of the first connector at the terminal end to the outer surface of the first connector in a direction toward the segment.

17. The plasma processing system of claim 11, wherein the thermal choke member thermally isolates the RF input rod from the RF strap and provides electrical interconnection between the RF strap and the RF input rod.

18. The plasma processing system of claim 11, wherein a base material of the thermal choke member comprises stainless steel or nickel-chromium-based superalloy, wherein an electrically conductive material is plated on the base material, wherein the conductive material comprises gold.

19. The plasma processing system of claim 11, wherein the RF strap is coupled to an impedance matching network of the RF source.

20. The plasma processing system of claim 11, wherein the segment comprises a step in the inner surface of the segment, wherein the step serves as a location stop for the RF input rod.

* * * * *